(12) United States Patent
Wehlus

(10) Patent No.: US 9,692,016 B2
(45) Date of Patent: Jun. 27, 2017

(54) OPTOELECTRONIC COMPONENT AND METHOD FOR PRODUCING AN OPTOELECTRONIC COMPONENT

(71) Applicant: OSRAM OLED GmbH, Regensburg (DE)

(72) Inventor: Thomas Wehlus, Lappersdorf (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 14/896,440

(22) PCT Filed: May 16, 2014

(86) PCT No.: PCT/EP2014/060146
§ 371 (c)(1),
(2) Date: Dec. 7, 2015

(87) PCT Pub. No.: WO2014/195116
PCT Pub. Date: Dec. 11, 2014

(65) Prior Publication Data
US 2016/0133879 A1    May 12, 2016

(30) Foreign Application Priority Data
Jun. 7, 2013    (DE) .......................... 10 2013 105 905

(51) Int. Cl.
*H01L 51/52* (2006.01)
*H01L 51/44* (2006.01)
(Continued)

(52) U.S. Cl.
CPC .... *H01L 51/5275* (2013.01); *G02F 1/133365* (2013.01); *G02F 1/133526* (2013.01);
(Continued)

(58) Field of Classification Search
None
See application file for complete search history.

(56) References Cited

U.S. PATENT DOCUMENTS 6,323,923 B1    11/2001   Hoshino et al.
2002/0145687 A1  10/2002   Mitsui et al.
(Continued)

FOREIGN PATENT DOCUMENTS

DE    102008023874 A1    8/2009
EP       0867104 B1     12/2002
(Continued)

OTHER PUBLICATIONS

International Search Report based on application No. PCT/EP2014/060146 (5 pages and 3 Pages of English translation) dated Sep. 11, 2014.

*Primary Examiner* — Fernando L Toledo
*Assistant Examiner* — Valerie N Newton
(74) *Attorney, Agent, or Firm* — Viering, Jentschura & Partner mbB

(57) ABSTRACT

Various embodiments may relate to an optoelectronic component and a method for producing an optoelectronic component. In various embodiments, an optoelectronic component is provided, the optoelectronic component, including an optically active structure, which is designed for receiving and/or providing electromagnetic radiation, and at least one scattering structure, which is formed in the beam path of the electromagnetic radiation on or above the optically active structure. The scattering structure is designed such that the directional characteristic of the electromagnetic radiation can be electrically modified.

14 Claims, 5 Drawing Sheets

(51) Int. Cl.
*G02F 1/1333* (2006.01)
*G02F 1/1335* (2006.01)
*H01L 51/56* (2006.01)
*H01L 51/00* (2006.01)

(52) U.S. Cl.
CPC ........ *H01L 51/447* (2013.01); *H01L 51/5268* (2013.01); *H01L 51/56* (2013.01); *G02F 2001/133565* (2013.01); *G02F 2201/44* (2013.01); *H01L 51/0076* (2013.01); *Y02E 10/549* (2013.01); *Y02P 70/521* (2015.11)

(56) References Cited

U.S. PATENT DOCUMENTS

| | | |
|---|---|---|
| 2005/0194896 A1 | 9/2005 | Sugita et al. |
| 2008/0035944 A1* | 2/2008 | Eberhard ............... H01L 33/44 257/98 |
| 2011/0163659 A1 | 7/2011 | Lang et al. |
| 2012/0206923 A1 | 8/2012 | Tanaka et al. |

FOREIGN PATENT DOCUMENTS

| | | |
|---|---|---|
| EP | 1763082 A2 | 3/2007 |
| EP | 1424739 B1 | 2/2012 |
| WO | 03061028 A2 | 7/2003 |
| WO | 2007114256 A1 | 10/2007 |

* cited by examiner

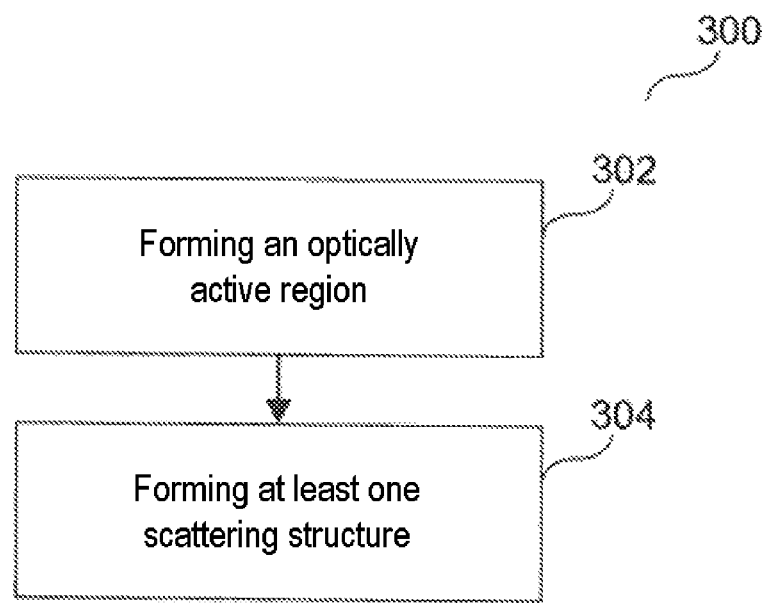

OPTOELECTRONIC COMPONENT AND METHOD FOR PRODUCING AN OPTOELECTRONIC COMPONENT

RELATED APPLICATIONS

The present application is a national stage entry according to 35 U.S.C. §371 of PCT application No.: PCT/EP2014/060146 filed on May 16, 2014 which claims priority from German application No.: 10 2013 105 905.8 filed on Jun. 7, 2013, and is incorporated herein by reference in its entirety.

TECHNICAL FIELD

In various embodiments, an optoelectronic component and a method for producing an optoelectronic component are provided.

BACKGROUND

Optoelectronic components on an organic basis, for example an organic light emitting diode (OLED), are being increasingly widely used in general lighting, for example as a surface light source. A conventional organic optoelectronic component, for example an OLED, may include an anode and a cathode with an organic functional layer system therebetween. The organic functional layer system includes one or a plurality of emitter layer(s) in which electromagnetic radiation is generated, one or a plurality of charge generating layer structure(s) each composed of two or more charge generating layers (CGL) for charge generation, and one or a plurality of electron blocking layer(s), also designated as hole transport layer(s) (HTL), and one or a plurality of hole blocking layer(s), also designated as electron transport layer(s) (ETL), in order to direct the current flow.

The areal luminous impression of an OLED is intended to be maintained as far as possible in many applications. In various applications, the emission characteristic of an OLED is intended to be able to be altered during operation, for example from a directional light beam to the beam profile of a Lambertian emitter.

In one conventional method, the emission characteristic of an optoelectronic component is altered by macroscopic optical components, for example by reflectors or lens systems. Such a macroscopic modification is unsuitable in surface light sources since the surface impression is lost.

In one conventional method, microlenses are used in an attempt to alter the emission characteristic of an organic light emitting diode. However, the emission characteristic of an OLED cannot thereby be altered in a variable manner.

In a further conventional method, a scattering structure is formed from microlenses embedded in a matrix, wherein the microlenses and the matrix have a different temperature-dependent refractive index. As a result, the emission characteristic can be altered depending on the temperature of the scattering structure. A temperature-controlled change of the emission characteristic is sluggish, however. Furthermore, such driving can be locally imprecise and produce an inhomogeneous appearance.

It is furthermore known to use liquid crystals to change the polarization of an electromagnetic radiation in liquid crystal screens and displays (liquid crystal display—LCD). Most liquid crystals are optically birefringent, which can be identified under a polarization microscope by characteristic textures. Under the influence of an external electric field, the orientation of some liquid crystals can be influenced in a targeted manner and, for example, the polarization of light can thus be altered.

SUMMARY

In various embodiments, an optoelectronic component and a method for producing an optoelectronic component are provided which make it possible to electrically alter the emission characteristic of organic light emitting diodes.

In various embodiments, an optoelectronic component is provided, the optoelectronic component including: an optically active structure designed for taking up and/or providing an electromagnetic radiation; and at least one scattering structure formed in the beam path of the electromagnetic radiation on or above the optically active structure; wherein the scattering structure is formed in such a way that the directional characteristic of the electromagnetic radiation is electrically variable.

In one configuration, the optically active structure may include a first electrode, a second electrode and an organic functional layer structure, wherein the organic functional layer structure is formed between the first electrode and the second electrode.

In one configuration, the optoelectronic component can be formed as an organic light emitting diode, an organic solar cell and/or an organic photodetector.

In one configuration, the optoelectronic component can be formed as a surface component.

In one configuration, the optoelectronic component can furthermore include a carrier, wherein the optically active structure and the scattering structure are formed on or above the carrier. As a result, for example, an optoelectronic component with a monolithically integrated scattering structure can be formed, i.e. the optically active structure and/or the scattering structure have/has substantially the same dimensioning as the carrier.

In one configuration, at least one scattering structure can be formed on the optically active structure and/or on that side of the carrier which faces away from the optically active structure. For example as retrofitting of an optoelectronic component.

In one configuration, the carrier can be formed such that it is transmissive with respect to the electromagnetic radiation.

In one configuration, the carrier can be formed in the beam path of the electromagnetic radiation.

In one configuration, the at least one scattering structure may include a plurality of scattering structures that are formed in the beam path of the optically active structure.

In one configuration, the optically active structure can be formed between a first scattering structure and a second scattering structure.

In one configuration, a first scattering structure can be formed in the beam path of the electromagnetic radiation between the optically active structure and a second scattering structure.

In one configuration, the scattering structure may include a third electrode, a fourth electrode and an electro-optical structure, wherein the electro-optical structure is formed electrically between the third electrode and the fourth electrode.

In one configuration, the scattering structure can be formed such that it is transmissive with respect to the electromagnetic radiation.

In one configuration, the scattering structure and the optically active structure may include a common electrode.

In one configuration, the scattering structure and/or the electro-optical structure may include at least one birefringent substance.

In one configuration, the scattering structure and/or the electro-optical structure may include at least one liquid crystalline substance, for example a liquid crystalline polymer.

In one configuration, the scattering structure and/or the electro-optical structure may include a microstructure, wherein the microstructure is formed in such a way that cavities are formed.

In one configuration, the birefringent substance can be formed in the cavities.

In one configuration, the cavities may include particles, wherein the particles are electrically polarizable and have at least one color-changing and/or reflective side. Depending on an applied electric field, the optical appearance can thereby be variable with the directional characteristic being changed.

In one configuration, the microstructure can be formed in such a way that they have a refractive index which is less than or equal to the layer-thickness-averaged refractive index of the organic functional layer structure.

In one configuration, the microstructure can be formed in such a way that they have a refractive index which is greater than or equal to the refractive index of the carrier.

In one configuration, the microstructure can be formed with respect to the electromagnetic radiation in such a way that an optically non-scattering interface is formed in the case of a first orientation of the birefringent substance and an optically scattering interface is formed in the case of a second orientation of the birefringent substance.

In various embodiments, a method for producing an optoelectronic component is provided, the method including: forming an optically active structure for taking up and/or providing an electromagnetic radiation; and forming at least one scattering structure in the beam path of the electromagnetic radiation on or above the optically active structure; wherein the scattering structure is formed in such a way that the directional characteristic of the electromagnetic radiation is electrically variable.

In one configuration of the method, forming the optically active structure may include: forming a first electrode; forming an organic functional layer structure on or above the first electrode; and forming a second electrode on or above the organic functional layer structure.

In one configuration of the method, the optoelectronic component can be formed as an organic light emitting diode, an organic solar cell and/or an organic photodetector.

In one configuration of the method, the optoelectronic component can be formed as a surface component.

In one configuration of the method, the method can furthermore include forming a carrier, wherein the optically active structure and the scattering structure are formed on or above the carrier.

In one configuration of the method, at least one scattering structure can be formed on the optically active structure and/or on that side of the carrier which faces away from the optically active structure.

In one configuration of the method, the carrier can be formed such that it is transmissive with respect to the electromagnetic radiation.

In one configuration of the method, the carrier can be formed in the beam path of the electromagnetic radiation.

In one configuration of the method, forming at least one scattering structure may include forming a plurality of scattering structures that are formed in the beam path of the optically active structure.

In one configuration of the method, the optically active structure can be formed between a first scattering structure and a second scattering structure.

In one configuration of the method, a first scattering structure can be formed in the beam path of the electromagnetic radiation between the optically active structure and a second scattering structure, for example by the first scattering structure being formed on the optically active structure, and the second scattering structure being formed on the first scattering structure; or in the opposite order.

In one configuration of the method, forming the scattering structure may include: forming a third electrode, forming an electro-optical structure on the third electrode, and forming a fourth electrode on the electro-optical structure.

In one configuration of the method, the scattering structure can be formed such that it is transmissive with respect to the electromagnetic radiation.

In one configuration of the method, the scattering structure and/or the scattering structure and the optically active structure can be formed in such a way that they include a common electrode.

In one configuration of the method, the scattering structure and/or the electro-optical structure can be formed in such a way that they/it include(s) at least one birefringent substance.

In one configuration of the method, the electro-optical structure can be formed in such a way that it includes at least one liquid crystalline substance, for example a liquid crystalline polymer.

In one configuration of the method, forming the electro-optical structure may include forming a microstructure in such a way that cavities are formed.

In one configuration of the method, the birefringent substance can be introduced into the cavities in such a way that the cavities are partly filled, completely filled or over-filled with birefringent substance.

In one configuration of the method, particles can be introduced into the cavities, wherein the particles are electrically polarizable and have at least one color-changing and/or reflective side.

In one configuration of the method, the microstructure can be formed in such a way that it has a refractive index that is less than or equal to the layer-thickness-averaged refractive index of the organic functional layer structure.

In one configuration of the method, the microstructure can be formed in such a way that it has a refractive index that is greater than or equal to the refractive index of the carrier.

In one configuration of the method, the microstructure can be formed with respect to the electromagnetic radiation in such a way that an optically non-scattering interface is formed in the case of a first orientation of the birefringent substance and an optically scattering interface is formed in the case of a second orientation of the birefringent substance.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which:

FIG. 4 shows an illustration concerning a method for producing an optoelectronic component in accordance with various embodiments.

DETAILED DESCRIPTION

Figure 1A:
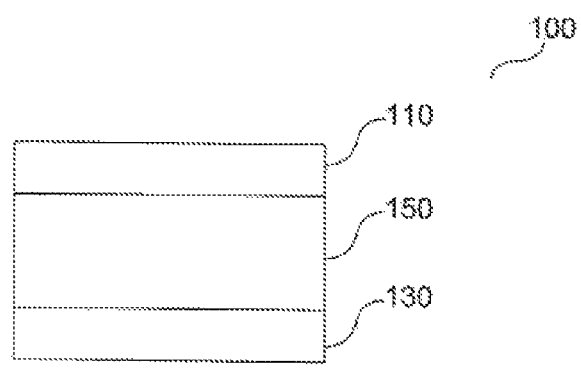
FIGS. 1A-1D show schematic illustrations of optoelectronic components in accordance with various embodiments.

In the following detailed description, reference is made to the accompanying drawings, which form part of this description and show for illustration purposes specific embodiments in which the invention can be implemented. In this regard, direction terminology such as, for instance, "at the top", "at the bottom", "at the front", "at the back", "front", "rear", etc. is used with respect to the orientation of the figure(s) described. Since component parts of embodiments can be positioned in a number of different orientations, the direction terminology serves for illustration and is not restrictive in any way whatsoever. It goes without saying that other embodiments can be used and structural or logical changes can be made, without departing from the scope of protection of the present invention. It goes without saying that the features of the various embodiments described herein can be combined with one another, unless specifically indicated otherwise. Therefore, the following detailed description should not be interpreted in a restrictive sense, and the scope of protection of the present invention is defined by the appended claims.

In the context of this description, the terms "connected" and "coupled" are used to describe both a direct and an indirect connection and a direct or indirect coupling. In the figures, identical or similar elements are provided with identical reference signs, insofar as this is expedient.

In various embodiments, optoelectronic components are described, wherein an optoelectronic component includes an optically active region. The optically active region can absorb electromagnetic radiation and form a photocurrent therefrom or emit electromagnetic radiation by means of a voltage applied to the optically active region. In various embodiments, the electromagnetic radiation can have a wavelength range including x-ray radiation, UV radiation (A-C), visible light and/or infrared radiation (A-C).

A planar optoelectronic component including two planar, optically active sides can be formed for example as transparent or translucent in the connection direction of the optically active sides, for example as a transparent or translucent organic light emitting diode. A planar optoelectronic component can also be formed as a plane optoelectronic component, for example as a plane-parallel optoelectronic component.

However, the optically active region can also have a planar, optically active side and a planar, optically inactive side, for example an organic light emitting diode formed as a top emitter or a bottom emitter. The optically inactive side can be transparent or translucent, for example, or be provided with a mirror structure and/or an opaque substance or substance mixture, for example for heat distribution. The beam path of the optoelectronic component can be directed on one side, for example.

In the context of this description, providing electromagnetic radiation can be understood to mean emitting electromagnetic radiation. In other words, providing electromagnetic radiation can be understood as emitting electromagnetic radiation by means of a voltage applied to an optically active region.

In the context of this description, taking up electromagnetic radiation can be understood to mean absorbing electromagnetic radiation. In other words: taking up electromagnetic radiation can be understood to mean absorbing electromagnetic radiation and forming a photocurrent from the absorbed electromagnetic radiation.

In various configurations, an electromagnetic radiation emitting structure can be an electromagnetic radiation emitting semiconductor structure and/or be formed as an electromagnetic radiation emitting diode, as an organic electromagnetic radiation emitting diode, as an electromagnetic radiation emitting transistor or as an organic electromagnetic radiation emitting transistor. The radiation can be for example light (in the visible range), UV radiation and/or infrared radiation. In this context, the electromagnetic radiation emitting component can be formed for example as a light emitting diode (LED), as an organic light emitting diode (OLED), as a light emitting transistor or as an organic light emitting transistor. In various configurations, the electromagnetic radiation emitting component can be part of an integrated circuit. Furthermore, a plurality of electromagnetic radiation emitting components can be provided, for example in a manner accommodated in a common housing.

In various embodiments, an optoelectronic structure can be formed as an organic light emitting diode (OLED), an organic field effect transistor (OFET) and/or an organic electronic system. The organic field effect transistor can be a so-called "all-OFET", in which all the layers are organic. An optoelectronic structure may include an organic functional layer system, which is synonymously also designated as organic functional layer structure. The organic functional layer structure may include or be formed from an organic substance or an organic substance mixture which is formed for example for providing an electromagnetic radiation from an electric current provided.

The optoelectronic component can be formed as an organic light emitting diode, an organic photodetector or an organic solar cell.

An organic light emitting diode can be formed as a top emitter or a bottom emitter. In the case of a bottom emitter, light is emitted from the electrically active region through the carrier. In the case of a top emitter, light is emitted from the top side of the electrically active region and not through the carrier.

A top emitter and/or bottom emitter can also be formed as optically transparent or optically translucent; by way of example, each of the layers or structures described below can be formed as transparent or translucent.

In the context of this description, a layer-thickness-averaged refractive index of a structure can be understood to mean the refractive index of the structure with respect to the electromagnetic radiation guided in the waveguide and emitted or absorbed by the optoelectronic component. In the case of a structure composed of a substance mixture, the averaging of the averaged refractive index can be carried out by way of the refractive index of the substances of the substance mixture in this wavelength range. In the case of a structure composed of a substance mixture, the averaging can be formed by means of forming the sum of the refractive indexes of the substances of the substance mixture in a manner weighted with their respective proportion by volume in the structure.

The directional characteristic of an optoelectronic component describes the solid angle dependence of the intensity of absorbable or emitted electromagnetic radiation. The directional characteristic for emitted electromagnetic radiation can also be referred to as emission characteristic. Specific emission characteristics have, for example, a linear, an elliptical, a rectangular, a batwing-shaped, a lobe-shaped or Lambertian intensity distribution. A switchable or variable emission characteristic can also be referred to as switchable emission direction. Changing the emission characteristic can be for example changing a Lambertian emission characteristic to form a batwing-shaped emission characteristic.

In the case of an optoelectronic component formed as a photodetector or solar cell, the directional characteristic can change for example the sensitivity with respect to incident electromagnetic radiation. As a result, the optoelectronic can be protected against electromagnetic radiation having an excessively high intensity. For example, overheating and/or degradation of organic substances can be reduced or avoided as a result.

FIGS. 1A-1D show schematic illustrations of optoelectronic components in accordance with various embodiments.

In various embodiments, an optoelectronic component 100 includes an optically active structure 150 and at least one scattering structure 110 on or above a hermetically impermeable substrate 130.

Figure 2A:
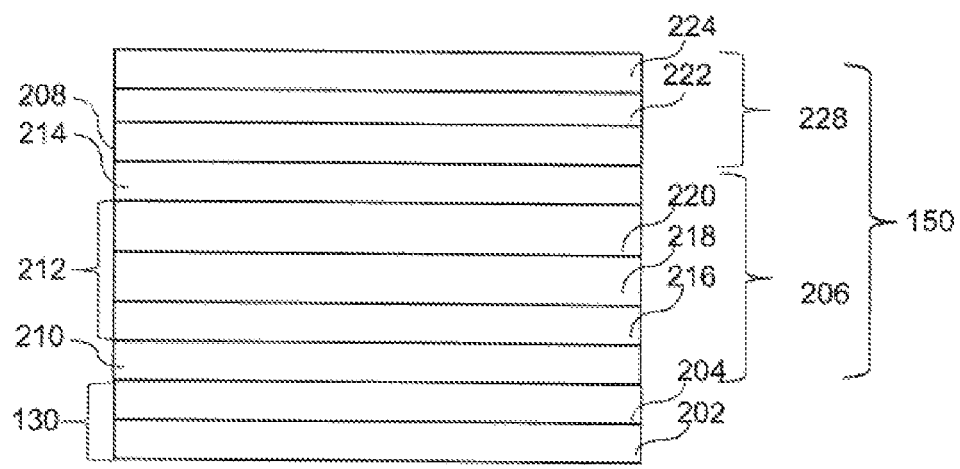
FIGS. 2A, and 2B show schematic cross-sectional views of optoelectronic components in accordance with various embodiments.

The optically active structure 150 is formed for taking up and/or providing an electromagnetic radiation and is described in greater detail for example in FIG. 2A.

The scattering structure 110 is formed in the beam path of the electromagnetic radiation on or above the optically active structure 150.

The scattering structure is formed in such a way that the directional characteristic of the electromagnetic radiation is electrically variable.

By means of a combination of liquid crystals and microstructured surfaces, it is possible to realize a scattering structure with which the emission characteristic of an OLED can be altered, for example can be set to a desired emission characteristic. The scattering structure includes a birefringent substance formed on or above a microstructure. A birefringent substance has different refractive indexes depending on the propagation direction and polarization of the electromagnetic radiation. As a result, the refractive index contrast at the interface between microstructure and birefringent substance is dependent on the angle of incidence of the electromagnetic radiation on said interface.

A birefringent substance is for example a liquid crystal in a birefringent phase, for example a liquid crystalline polymer. A liquid crystal is, on the one hand, liquid like a liquid substance and has, on the other hand, direction-dependent (anisotropic) physical properties like a crystal.

In one configuration, the microstructure is formed with respect to the structure of the birefringent substance in such a way that, in the case of at least one orientation of the birefringent substance with respect to the microstructure in an electric field, the scattering structure is non-scattering for the electromagnetic radiation. Such a non-scattering arrangement can be realized if the refractive index contrast at the interface between microstructure and birefringent substance in the propagation direction of the electromagnetic radiation is negligibly low.

The hermetically impermeable substrate 130 may include a carrier and a first barrier layer. Configurations of the hermetically impermeable substrate 130 are described in greater detail in FIGS. 2A and 2B.

Figure 1B:
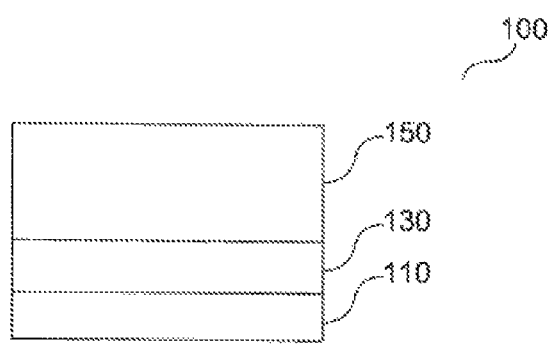

The optically active structure 150 can be formed directly on the hermetically impermeable substrate 130 and the scattering structure 110 can be formed on the optically active structure 150 (illustrated in FIG. 1A) or on that side of the hermetically impermeable substrate 130 which faces away from the optically active structure 150 (illustrated in FIG. 1B). As a result, the scattering structure 110 can be formed after the production of the optically active structure 150 in the beam path of the electromagnetic radiation. By way of example, the scattering structure 110 can be applied by adhesive bonding. The electromagnetic radiation can be emitted and/or absorbed by the hermetically impermeable substrate 130 and/or by a side of the optically active structure 150 which faces away from the hermetically impermeable substrate 130.

Figure 1C:
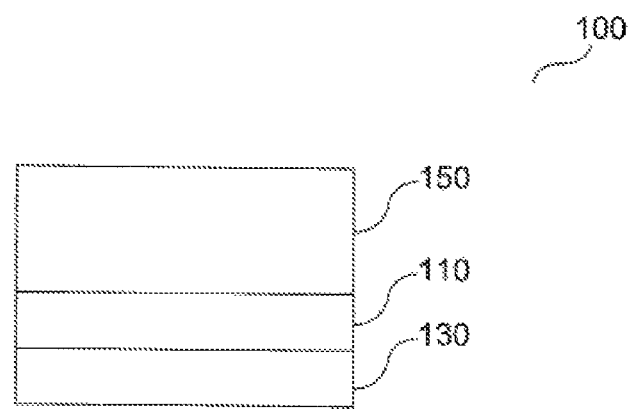
Figure 1D:
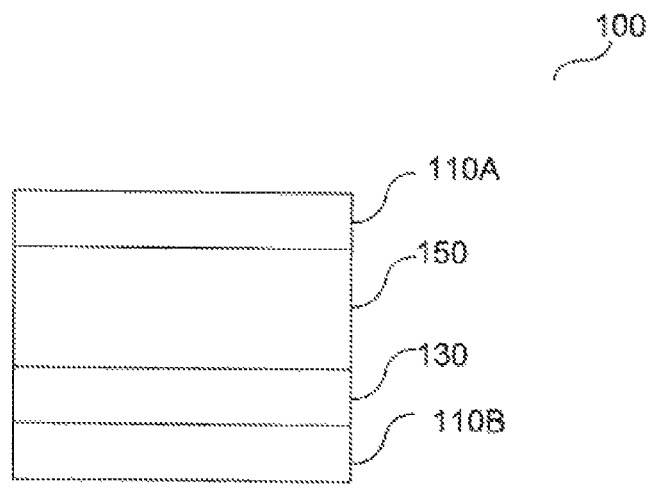

A scattering structure 110 can also be formed between the optically active structure 150 and the hermetically impermeable substrate 130 in the beam path of the electromagnetic radiation (illustrated in FIG. 1C). In this configuration, the hermetically impermeable substrate 130 can be transmissive and/or reflective with respect to the electromagnetic radiation. In this configuration, the optically active structure 150 can be formed on the scattering structure 110; and together with the scattering structure 110 have a common electrode.

The at least one scattering structure 110 may include a plurality of scattering structures. The optically active structure 150 can be formed between a first scattering structure 110A and a second scattering structure 110B (illustrated in FIG. 1D) and/or a first scattering structure 110A can be formed in the beam path of the electromagnetic radiation between the optically active structure 150 and a second scattering structure 110B. As a result, directional characteristics can be realized differently, for example different emission characteristics for the different sides of the hermetically impermeable substrate 130. Furthermore, the plurality of scattering structures 110A, 110B can be formed differently, for example of different electrically variable directional characteristics, include differently functional particles (see the description of FIG. 2B) and/or be structured differently. As a result, for example, information can be represented, for example a pictogram, lettering, an ideogram and/or a predefined directional characteristic.

In one configuration, in the beam path of the electromagnetic radiation the scattering structure 110 can be formed between a carrier and the optically active structure 150 (illustrated in FIG. 1C). The scattering structure 110 can be formed in such a way that it has a refractive index whose absolute value of the real part of the refractive index is greater than the absolute value of the real part of the carrier and less than the absolute value of the real part of the layer-thickness-averaged refractive index of the organic functional layer structure of the optically active structure 150. As a result, the scattering structure 110 can increase the coupling-out of electromagnetic radiation from the optoelectronic component 100.

In one configuration, in the beam path of the electromagnetic radiation a carrier can be formed between the scattering structure 110 and the optically active structure 150 (illustrated in FIG. 1B). The scattering structure 110 can be formed in such a way that it has a refractive index whose absolute value of the real part of the refractive index is less than the absolute value of the real part of the refractive index of the carrier. As a result, the scattering structure 110 can increase the coupling-out of electromagnetic radiation from the optoelectronic component 100.

Figure 2B:
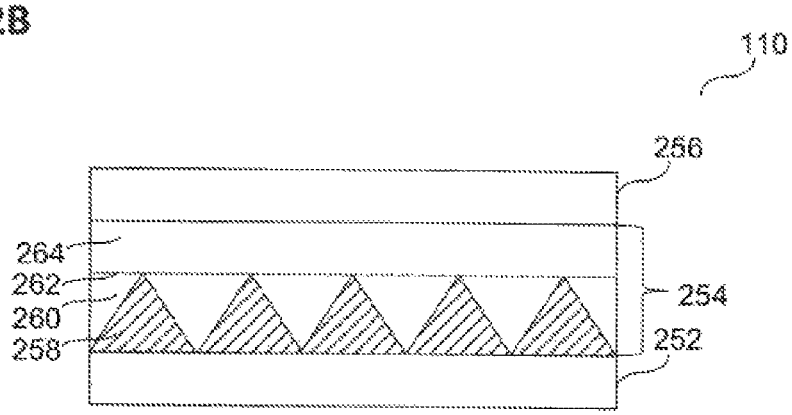

FIGS. 2A, and 2B show schematic cross-sectional views of optoelectronic components in accordance with various embodiments.

FIG. 2A shows a schematic cross-sectional view of the optically active region and of the hermetically impermeable substrate in accordance with various embodiments.

The optoelectronic component 100 includes a hermetically impermeable substrate 130 and an optically active structure 150 on or above the hermetically impermeable substrate. The optically active structure 150 includes an active region 206 and an encapsulation structure 228.

The active region 206 is an electrically active region 206 and/or an optically active region 206. The active region 206 is for example the region of the optoelectronic component 100 in which electric current for the operation of the optoelectronic component 100 flows and/or in which electromagnetic radiation is generated and/or absorbed.

The electrically active region 206 may include a first electrode 210, an organic functional layer structure 212 and a second electrode 214.

The organic functional layer structure 212 may include one, two or more functional layer structure units and one, two or more intermediate layer structure(s) between the layer structure units. The organic functional layer structure 212 may include for example a first organic functional layer structure unit 216, an intermediate layer structure 218 and a second organic functional layer structure unit 220.

The encapsulation structure 228 may include a second barrier layer 208, a close connection layer 222 and a cover 224.

The carrier 202 may include or be formed from glass, quartz and/or a semiconductor material. Furthermore, the carrier may include or be formed from a plastics film or a laminate including one or including a plurality of plastics films. The plastic may include or be formed from one or a plurality of polyolefins (for example high or low density polyethylene (PE) or polypropylene (PP)). Furthermore, the plastic may include or be formed from polyvinyl chloride (PVC), polystyrene (PS), polyester and/or polycarbonate (PC), polyethylene terephthalate (PET), polyethersulfone (PES) and/or polyethylene naphthalate (PEN).

The carrier 202 may include or be formed from a metal, for example copper, silver, gold, platinum, iron, for example a metal compound, for example steel.

The carrier 202 can be embodied as opaque, translucent or even transparent.

The carrier 202 can be a part of a mirror structure or form the latter.

The carrier 202 can have a mechanically rigid region and/or a mechanically flexible region or be formed in this way, for example as a film.

The carrier 202 can be formed as a waveguide for electromagnetic radiation, for example can be transparent or translucent with respect to the emitted or absorbed electromagnetic radiation of the optoelectronic component 100.

The first barrier layer 204 may include or be formed from one of the following materials: aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, poly(p-phenylene terephthalamide), nylon 66, and mixtures and alloys thereof.

The first barrier layer 204 can be formed by means of one of the following methods: an atomic layer deposition (ALD) method, for example a plasma enhanced atomic layer deposition (PEALD) method or a plasmaless atomic layer deposition (PLALD) method; a chemical vapor deposition (CVD) method, for example a plasma enhanced chemical vapor deposition (PECVD) method or a plasmaless chemical vapor deposition (PLCVD) method; or alternatively by means of other suitable deposition methods.

In the case of a first barrier layer 204 including a plurality of partial layers, all the partial layers can be formed by means of an atomic layer deposition method. A layer sequence including only ALD layers can also be designated as a "nanolaminate".

In the case of a first barrier layer 204 including a plurality of partial layers, one or a plurality of partial layers of the first barrier layer 204 can be deposited by means of a different deposition method than an atomic layer deposition method, for example by means of a vapor deposition method.

The first barrier layer 204 can have a layer thickness of approximately 0.1 nm (one atomic layer) to approximately 1000 nm, for example a layer thickness of approximately 10 nm to approximately 100 nm in accordance with one configuration, for example approximately 40 nm in accordance with one configuration.

The first barrier layer 204 may include one or a plurality of high refractive index materials, for example one or a plurality of materials having a high refractive index, for example having a refractive index of at least two.

Furthermore, it should be pointed out that, in various embodiments, a first barrier layer 204 can also be entirely dispensed with, for example for the case where the carrier 202 is formed in a hermetically impermeable fashion, for example includes or is formed from glass, metal, metal oxide.

The first electrode 204 can be formed as an anode or as a cathode.

The first electrode 210 may include or be formed from one of the following electrically conductive materials: a metal; a transparent conductive oxide (TCO); a network composed of metallic nanowires and nanoparticles, for example composed of Ag, which are combined with conductive polymers, for example; a network composed of carbon nanotubes which are combined with conductive polymers, for example; graphene particles and graphene layers; a network composed of semiconducting nanowires; an electrically conductive polymer; a transition metal oxide; and/or the composites thereof. The first electrode 210 composed of a metal or including a metal may include or be formed from one of the following materials: Ag, Pt, Au, Mg, Al, Ba, In, Ca, Sm or Li, and compounds, combinations or alloys of these materials. The first electrode 210 may include as transparent conductive oxide one of the following materials: for example metal oxides: for example zinc oxide, tin oxide, cadmium oxide, titanium oxide, indium oxide, or indium tin oxide (ITO). Alongside binary metal-oxygen compounds, such as, for example, $ZnO$, $SnO_2$, or $In_2O_3$, ternary metal-oxygen compounds, such as, for example, $AlZnO$, $Zn\,SnO_4$, $CdSnO_3$, $ZnSnO_3$, $MgIn_2O_4$, $GaInO_3$, $Zn\,In_2O_5$ or $In_4Sn_3O_{12}$, or mixtures of different transparent conductive oxides also belong to the group of TCOs and can be used in various embodiments. Furthermore, the TCOs do not necessarily correspond to a stoichiometric composition and can furthermore be p-doped or n-doped or be hole-conducting (p-TCO), or electron-conducting (n-TCO).

The first electrode 210 may include a layer or a layer stack of a plurality of layers of the same material or different materials. The first electrode 210 can be formed by a layer stack of a combination of a layer of a metal on a layer of a TCO, or vice versa. One example is a silver layer applied on an indium tin oxide layer (ITO) (Ag on ITO) or ITO-Ag-ITO multilayers.

The first electrode 204 can have for example a layer thickness in a range of 10 nm to 500 nm, for example of less than 25 nm to 250 nm, for example of 50 nm to 100 nm.

The first electrode 210 can have a first electrical terminal, to which a first electrical potential can be applied. The first electrical potential can be provided by an energy source, for example a current source or a voltage source. Alternatively, the first electrical potential can be applied to an electrically conductive carrier 202 and the first electrode 210 can be electrically supplied indirectly through the carrier 202. The first electrical potential can be for example the ground potential or some other predefined reference potential.

FIGS. 1A-1D illustrates an optoelectronic component 100 including a first organic functional layer structure unit 216 and a second organic functional layer structure unit 220. In various embodiments, however, the organic functional layer structure 212 can also include only one or more than two organic functional layer structures, for example 3, 4, 5, 6, 7, 8, 9, 10, or even more, for example 15 or more, for example 70.

The first organic functional layer structure unit 216 and the optionally further organic functional layer structures can be formed identically or differently, for example include an identical or different emitter material. The second organic functional layer structure unit 220, or the further organic functional layer structure units can be formed like one of the below-described configurations of the first organic functional layer structure unit 216.

The first organic functional layer structure unit 216 may include a hole injection layer, a hole transport layer, an emitter layer, an electron transport layer and an electron injection layer.

In an organic functional layer structure unit 212, one or a plurality of the layers mentioned can be provided, wherein identical layers can have a physical contact, can be only electrically connected to one another or can even be formed in a manner electrically insulated from one another, for example can be arranged alongside one another. Individual layers of the layers mentioned can be optional.

A hole injection layer can be formed on or above the first electrode 210. The hole injection layer may include or be formed from one or a plurality of the following materials: HAT-CN, Cu(I)pFBz, MoO$_x$, WO$_x$, VO$_x$, ReO$_x$, F4-TCNQ, NDP-2, NDP-9, Bi(III)pFBz, F16CuPc; NPB (N,N'-bis(naphthalen-1-yl)-N,N'-bis(phenyl)benzidine); beta-NPB N,N'-bis(naphthalen-2-yl)-N,N'-bis(phenyl)benzidine); TPD (N,N'-bis(3-methylphenyl)-N,N'-bis(phenyl)benzidine); Spiro TPD (N,N'-bis(3-methylphenyl)-N,N'-bis(phenyl)benzidine); spiro-NPB (N,N'-bis(naphthalen-1-yl)-N,N'-bis(phenyl)spiro); DMFL-TPD N,N'-bis(3-methylphenyl)-N,N'-bis(phenyl)-9,9-dimethylfluorene); DMFL-NPB (N,N'-bis(napthalen-1-yl)-N,N'-bis(phenyl)-9,9-dimethylfluorene); DPLF-TPD (N,N'-bis(3-methylphenyl)-N,N'-bis(phenyl)-9,9-diphenylfluorene); DPFL-NPB (N,N'-bis(naphthalen-1-yl)-N,N'-bis(phenyl)-9,9-diphenylfluorene); spiro-TAD (2,2',7,7'-tetrakis(n,n-diphenylamino)-9,9'-spirobifluorene); 9,9-bis[4-(N,N-bisphenyl-4-yl-amino)phenyl]-9H-fluorene; 9,9-bis[4-(N,N-bis-napthalen-2-yl-amino)phenyl]-9H-fluorene; 9,9-bis[4-(N,N'-bisnaphthalen-2-yl-N,N'-bisphenylamino)phenyl]-9H-fluorene; N,N'-bis(phenanthren-9-yl)-N,N'-bis(phenyl)benzidine; 2,7-bis[N,N-bis(9,9-spirobifluoren-2-yl)amino]-9,9-spirobifluorene; 2,2'-bis[N,N-bis(biphenyl-4-yl)amino]9,9-spirobifluorene; 2,2'-bis(N,N-diphenylamino)-9,9-spirobifluorene; di-[4-(N,N-ditolylamino)phenyl]cyclohexane; 2,2',7,7-tetra(N,N-di-tolyl)aminospirobifluorene; and/or N,N,N',N'-tetra-naphthen-2-ylbenzidine.

The hole injection layer can have a layer thickness in a range of approximately 10 nm to approximately 1000 nm, for example in a range of approximately 30 nm to approximately 300 nm, for example in a range of approximately 50 nm to approximately 200 nm.

A hole transport layer can be formed on or above the hole injection layer. The hole transport layer may include or be formed from one or a plurality of the following materials: NPB (N,N'-bis(naphthalen-1-yl)-N,N'-bis(phenyl)benzidine); beta-NPB N,N'-bis(naphthalen-2-yl)-N,N'-bis(phenyl)benzidine); TPD (N,N'-bis(3-methylphenyl)-N,N'-bis(phenyl)benzidine); Spiro TPD (N,N'-bis(3-methylphenyl)-N,N'-bis(phenyl)benzidine); spiro-NPB (N,N'-bis(naphthalen-1-yl)-N,N'-bis(phenyl)spiro); DMFL-TPD N,N'-bis(3-methylphenyl)-N,N'-bis(phenyl)-9,9-dimethylfluorene); DMFL-NPB (N,N'-bis(naphthalen-1-yl)-N,N'-bis(phenyl)-9,9-dimethylfluorene); DPFL-TPD (N,N'-bis(3-methylphenyl)-N,N'-bis(phenyl)-9,9-diphenylfluorene); DPFL-NPB (N,N'-bis(naphthalen-1-yl)-N,N'-bis(phenyl)-9,9-diphenylfluorene); Spiro-TAD (2,2',7,7'-tetra-kis(n,n-diphenylamino)-9,9'-spirobifluorene); 9,9-bis[4-(N,N-bisbiphenyl-4-yl-amino)phenyl]-9H-fluorene; 9,9-bis[4-(N,N'-bisnaphthalen-2-ylamino)phenyl]-9H-fluorene; 9,9-bis[4-(N,N'-bisnaphthalen-2-yl-N—N'-bisphenylamino)-phenyl]-9H-fluorene; N,N-bis(phenanthren-9-yl)-N,N'-bis(phenyl)benzidine; 2,7-bis[N,N-bis(9,9-spirobifluoren-2-yl)amino]-9,9-spirobifluorene; 2,2'-bis[N,N-bis(biphenyl-4-yl)amino]9,9-spirobifluorene; 2,2'-bis(N,N-diphenylamino)9,9-spirobifluorene; di-[4-(N,N-ditolylamino)phenyl]cyclohexane; 2,2',7,7'-tetra(N,N-di-ditolyl)aminospirobifluorene; and N,N,N',N'-tetranaphthalen-2-ylbenzidine, a tertiary amine, a carbazole derivative, a conductive polyaniline and/or polyethylene dioxythiophene.

The hole transport layer can have a layer thickness in a range of approximately 5 nm to approximately 50 nm, for example in a range of approximately 10 nm to approximately 30 nm, for example approximately 20 nm.

An emitter layer can be formed on or above the hole transport layer. Each of the organic functional layer structure units 216, 220 may include in each case one or a plurality of emitter layers, for example including fluorescent and/or phosphorescent emitters.

An emitter layer may include or be formed from organic polymers, organic oligomers, organic monomers, organic small, non-polymer molecules ("small molecules") or a combination of these materials.

The optoelectronic component 100 may include or be formed from one or a plurality of the following materials in an emitter layer: organic or organometallic compounds such as derivatives of polyfluorene, polythiophene and polyphenylene (e.g. 2- or 2,5-substituted poly-p-phenylene vinylene) and metal complexes, for example iridium complexes such as blue phosphorescent FIrPic (bis(3,5-difluoro-2-(2-pyridyl)phenyl(2-carboxypyridyl)iridium III), green phosphorescent Ir(ppy)$_3$ (tris(2-phenylpyridine)iridium III), red phosphorescent Ru (dtb-bpy)$_3$*2(PF$_6$) (tris[4,4'-di-tert-butyl-(2,2')-bipyridine]ruthenium(III) complex) and blue fluorescent DPAVBi (4,4-bis[4-(di-p-tolylamino)styryl]biphenyl), green fluorescent TTPA (9,10-bis[N,N-di(p-tolyl)amino]anthracene) and red fluorescent DCM2 (4-dicyanomethylene)-2-methyl-6-julolidyl-9-enyl-4H-pyran) as non-polymeric emitters.

Such non-polymeric emitters can be deposited for example by means of thermal evaporation. Furthermore, polymer emitters can be used which can be deposited for example by means of a wet-chemical method, such as, for example, a spincoating method.

The emitter materials can be embedded in a suitable manner in a matrix material, for example a technical ceramic or a polymer, for example an epoxy; or a silicone.

In various embodiments, the first emitter layer 234 can have a layer thickness in a range of approximately 5 nm to approximately 50 nm, for example in a range of approximately 10 nm to approximately 30 nm, for example approximately 20 nm.

The emitter layer may include emitter materials that emit in one color or in different colors (for example blue and yellow or blue, green and red). Alternatively, the emitter layer may include a plurality of partial layers which emit light of different colors. By means of mixing the different colors, the emission of light having a white color impression can result. Alternatively, provision can also be made for arranging a converter material in the beam path of the primary emission generated by said layers, which converter material at least partly absorbs the primary radiation and emits a secondary radiation having a different wavelength, such that a white color impression results from a (not yet white) primary radiation by virtue of the combination of primary radiation and secondary radiation.

The organic functional layer structure unit 216 may include one or a plurality of emitter layers embodied as hole transport layer.

Furthermore, the organic functional layer structure unit 216 may include one or a plurality of emitter layers embodied as electron transport layer.

An electron transport layer can be formed, for example deposited, on or above the emitter layer.

The electron transport layer may include or be formed from one or a plurality of the following materials: NET-18; 2,2',2''-(1,3,5-benzinetriyl)tris(1-phenyl-1-H-benzimidazole); 2-(4-biphenylyl)-5-(4-tert-butylphenyl)-1,3,4-oxadizole, 2,9-dimethyl-4,7-diphenyl-1,10-phenanthroline (BCP); 8-hydroxyquinolinolato lithium; 4-(naphthalen-1-yl)-3,5-diphenyl-4H-1,2,4-triazole; 1,3-bis[2-(2,2'-bipyridin-6-yl)-1,3,4-oxadiazo-5-yl]benzene; 4,7-diphenyl-1,10-phenanthroline (BPhen); 3-(4-biphenylyl)-4-phenyl-5-tert-butylphenyl-1,2,4-triazole; bis(2-methyl-8-quinolinolate)-4-(phenylphenolato)aluminum; 6,6'-bis[5-(biphenyl-4-yl)-1,3,4-oxadiazo-2-yl]-2,2'-bipyridyl; 2-phenyl-9,10-di(naphthalen-2-yl)anthracene; 2,7-bis[2-(2,2'-bipyridin-6-yl)-1,3,4-oxadiazo-5-yl]-9,9-dimethylfluorene; 1,3-bis[2-(4-tert-butylphenyl)-1,3,4-oxadiazo-5-yl]benzene; 2-(naphthalen-2-yl)-4,7-diphenyl-1,10-phenanthroline; 2,9-bis(naphthalen-2-yl)-4,7-diphenyl-1,10-phenanthroline; tris(2,4,6-trimethyl-3-(pyridin-3-yl)phenyl)borane; 1-methyl-2-(4-naphthalen-2-yl)phenyl)-1H-imidazo[4,5-f][1,10] phenanthroline; phenyl-dipyrenylphosphine oxide; naphthalenetetracarboxylic dianhydride or the imides thereof; perylenetetracarboxylic dianhydride or the imides thereof; and substances based on silols including a silacyclopentadiene unit.

The electron transport layer can have a layer thickness in a range of approximately 5 nm to approximately 50 nm, for example in a range of approximately 10 nm to approximately 30 nm, for example approximately 20 nm.

An electron injection layer can be formed on or above the electron transport layer. The electron transport layer may include or be formed from one or a plurality of the following materials: NDN-26, MgAg, Cs CO$_3$, Cs$_3$PO$_4$, Na, Ca, K, Mg, Cs, Li, LiF; 2,2',2''-(1,3,5-benzinetriyl)tris(1-phenyl-1-H-benzimidazole); 2-(4-biphenylyl)-5-(4-tert-butylphenyl)-1,3,4-oxadiazole, 2,9-dimethyl-4,7-diphenyl-1,10-phenanthroline (BCP); 8-hydroxyquinolinolato lithium, 4-(naphthalen-1-yl)-3,5-diphenyl-4H-1,2,4-triazole; 1,3-bis[2-(2,2'-biypridin-6-yl)-1,3,4-oxadiazo-5-yl)benzene; 4,7-diphenyl-1,10-phenanthroline (BPhen); 3-(4-biphenylyl)-4-phenyl-5-tert-butylphenyl-1,2,4-triazole; bis(2-methyl-8-quinolinolate)-4-(phenylphenolato)aluminum; 6,6'-bis(5-(biphenyl-4-yl)-1,3,4-oxadiazo-2-yl]-2,2'-bipyridyl; 2-phenyl-9,10-di(naphthalen-2-yl)anthracene; 2,7-bis[2-(2,2'-bipyridin-6-yl)-1,3,4-oxadiazo-5-yl]-9,9-dimethylfluorene; 1,3-bis[2-(4-tert-butylphenyl)-1,3,4-oxadiazo-5-yl]benzene; 2-(naphthalen-2-yl)-4,7-diphenyl-1,10-phenanthroline; 2,9-bis(naphthalen-2-yl)-4,7-diphenyl-1,10-phenanthroline; tris(2,4,6-trimethyl-3-(pyridine-3-yl)phenyl)borane; 1-methyl-2-(4-(naphthalen-2-yl)phenyl)-1H-imidazo[4,5-f][1,10]phenanthroline; phenyldipyrenylphosphine oxide; naphthalenetetracarboxylic dianhydride or the imides thereof; perylenetetracarboxylic dianhydride or the imides thereof; and substances based on silols including a silacyclopentadiene unit.

The electron injection layer can have a layer thickness in a range of approximately 5 nm to approximately 200 nm, for example in a range of approximately 20 nm to approximately 50 nm, for example approximately 30 nm.

In the case of an organic functional layer structure 212 including two or more organic functional layer structure units 216, 220, the second organic functional layer structure unit 220 can be formed above or alongside the first functional layer structure units 216. An intermediate layer structure 218 can be formed electrically between the organic functional layer structure units 216, 220.

In various embodiments, the intermediate layer structure 218 can be formed as an intermediate electrode 218, for example in accordance with one of the configurations of the first electrode 210. An intermediate electrode 218 can be electrically connected to an external voltage source. The external voltage source can provide a third electrical potential, for example at the intermediate electrode 218. However, the intermediate electrode 218 can also have no external electrical connection, for example by the intermediate electrode having a floating electrical potential.

In various embodiments, the intermediate layer structure 218 can be formed as a charge generating layer structure 218 (charge generation layer CGL). A charge generating layer structure 218 may include one or a plurality of electron-conducting charge generating layer(s) and one or a plurality of hole-conducting charge generating layer(s). The electron-conducting charge generating layer(s) and the hole-conducting charge generating layer(s) can be formed in each case from an intrinsically conductive substance or a dopant in a matrix. The charge generating layer structure 218 should be formed, with respect to the energy levels of the electron-conducting charge generating layer(s) and the hole-conducting charge generating layer(s), in such a way that electron and hole can be separated at the interface between an electron-conducting charge generating layer and a hole-conducting charge generating layer. The charge generating layer structure 218 can furthermore have a diffusion barrier between adjacent layers.

Each organic functional layer structure unit 216, 220 can have for example a layer thickness of a maximum of approximately 3 μm, for example a layer thickness of a maximum of approximately 1 μm, for example a layer thickness of a maximum of approximately 300 nm.

The optoelectronic component 100 can optionally include further organic functional layers, for example arranged on or above the one or the plurality of emitter layers or on or above the electron transport layer(s). The further organic functional layers can be for example internal or external coupling-in/coupling-out structures that further improve the functionality and thus the efficiency of the optoelectronic component 100.

The second electrode 214 can be formed on or above the organic functional layer structure 212 or, if appropriate, on or above the one or the plurality of further organic functional layer structures and/or organic functional layers.

The second electrode 214 can be formed in accordance with one of the configurations of the first electrode 210, wherein the first electrode 210 and the second electrode 214 can be formed identically or differently. The second electrode 214 can be formed as an anode, that is to say as a hole-injecting electrode, or as a cathode, that is to say as an electron-injecting electrode.

The second electrode 214 can have a second electrical terminal, to which a second electrical potential can be applied. The second electrical potential can be provided by the same energy source as, or a different energy source than, the first electrical potential and/or the optional third electrical potential. The second electrical potential can be different than the first electrical potential and/or the optionally third electrical potential. The second electrical potential can have for example a value such that the difference with respect to the first electrical potential has a value in a range of approximately 1.5 V to approximately 20 V, for example a value in a range of approximately 2.5 V to approximately 15 V, for example a value in a range of approximately 3 V to approximately 12 V.

The second barrier layer 208 can be formed on the second electrode 214.

The second barrier layer 208 can also be referred to as thin film encapsulation (TFE). The second barrier layer 208 can be formed in accordance with one of the configurations of the first barrier layer 204.

Furthermore, it should be pointed out that, in various embodiments, a second barrier layer 208 can also be entirely dispensed with. In such a configuration, the optoelectronic component 100 may include for example a further encapsulation structure, as a result of which a second barrier layer 208 can become optional, for example a cover 224, for example a cavity glass encapsulation or metallic encapsulation.

Furthermore, in various embodiments, in addition, one or a plurality of coupling-in/-out layers can also be formed in the optoelectronic component 100, for example an external coupling-out film on or above the carrier 202 (not illustrated) or an internal coupling-out layer (not illustrated) in the layer cross section of the optoelectronic component 100. The coupling-in/-out layer may include a matrix and scattering centers distributed therein, wherein the average refractive index of the coupling-in/-out layer is greater than the average refractive index of the layer from which the electromagnetic radiation is provided. Furthermore, in various embodiments, in addition, one or a plurality of antireflection layers (for example combined with the second barrier layer 208) can be provided in the optoelectronic component 100.

In various embodiments, a close connection layer 222, for example composed of an adhesive or a lacquer, can be provided on or above the second barrier layer 208. By means of the close connection layer 222, a cover 224 can be closely connected, for example adhesively bonded, on the second barrier layer 208.

A close connection layer 222 composed of a transparent material may include for example particles which scatter electromagnetic radiation, for example light-scattering particles. As a result, the close connection layer 222 can act as a scattering layer and lead to a further improvement in the color angle distortion and the coupling-out efficiency.

The light-scattering particles provided can be dielectric scattering particles, for example composed of a metal oxide, for example, silicon oxide ($SiO_2$), zinc oxide (ZnO), zirconium oxide ($ZrO_2$), indium tin oxide (ITO) or indium zinc oxide (IZO), gallium oxide ($Ga_2O_x$), aluminum oxide, or titanium oxide. Other particles may also be suitable provided that they have a refractive index that is different than the effective refractive index of the matrix of the close connection layer 222, for example air bubbles, acrylate, or hollow glass beads. Furthermore, by way of example, metallic nanoparticles, metals such as gold, silver, iron nanoparticles, or the like can be provided as light-scattering particles.

The close connection layer 222 can have a layer thickness of greater than 1 μm, for example a layer thickness of a plurality of μm. In various embodiments, the close connection layer 222 may include or be a lamination adhesive.

The close connection layer 222 can be designed in such a way that it includes an adhesive having a refractive index that is less than the refractive index of the cover 224. Such an adhesive can be for example a low refractive index adhesive such as, for example, an acrylate having a refractive index of approximately 1.3. However, the adhesive can also be a high refractive index adhesive which for example includes high refractive index, non-scattering particles and has a layer-thickness-averaged refractive index that approximately corresponds to the average refractive index of the organic functional layer structure 212, for example in a range of approximately 1.7 to approximately 2.0. Furthermore, a plurality of different adhesives can be provided which form an adhesive layer sequence.

In various embodiments, between the second electrode 214 and the close connection layer 222, an electrically insulating layer (not shown) can also be applied, for example SiN, for example having a layer thickness in a range of approximately 300 nm to approximately 1.5 μm, for example having a layer thickness in a range of approximately 500 nm to approximately 1 μm, in order to protect electrically unstable materials, during a wet-chemical process for example.

In various embodiments, a close connection layer 222 can be optional, for example if the cover 224 is formed directly on the second barrier layer 208, for example a cover 224 composed of glass that is formed by means of plasma spraying.

Furthermore, a so-called getter layer or getter structure, for example a laterally structured getter layer, can be arranged (not illustrated) on or above the electrically active region 206.

The getter layer may include or be formed from a material that absorbs and binds substances that are harmful to the electrically active region 206. A getter layer may include or be formed from a zeolite derivative, for example. The getter layer can be formed as translucent, transparent or opaque and/or non-transmissive with respect to the electromagnetic radiation that is emitted and/or absorbed in the optically active region.

The getter layer can have a layer thickness of greater than approximately 1 μm, for example a layer thickness of a plurality of μm.

In various embodiments, the getter layer may include a lamination adhesive or be embedded in the close connection layer 222.

A cover 224 can be formed on or above the close connection layer 222. The cover 224 can be closely connected to the electrically active region 206 by means of the close connection layer 222 and can protect said region from harmful substances. The cover 224 can be for example a glass cover 224, a metal film cover 224 or a sealed plastics film cover 224. The glass cover 224 can be closely connected to the second barrier layer 208 or the electrically active region 206 for example by means of frit bonding (glass soldering/seal glass bonding) by means of a conventional glass solder in the geometric edge regions of the organic optoelectronic component 100.

The cover 224 and/or the close connection layer 222 can have a refractive index (for example at a wavelength of 633 nm) of 1.55.

FIG. 2B shows a schematic cross-sectional view of the scattering structure in accordance with various embodiments.

The scattering structure 110 may include a third electrode 252, an electro-optical structure 254 on the third electrode 252, and a fourth electrode 256 on the electro-optical structure 254. The scattering structure 110 can be formed such that it is transmissive with respect to the electromagnetic radiation, for example, transparent or translucent.

The electro-optical structure 254 may include a microstructure 258. The microstructure 258 is formed in such a way that a plurality of cavities 260 are formed above the microstructure 258 in the electro-optical structure 110. In FIG. 2B, the cavities are intended to be illustrated by means of the dotted delimiting line bearing the reference sign 262.

The microstructures 258 should be formed such that they are transmissive with respect to the electromagnetic radiation. The microstructures 258 can be formed for example from a transmissive technical ceramic and/or a transmissive polymer, for example $SiO_2$, $Al_2O_3$, a silicone, an epoxy, a polyacrylate, an adhesive (for example in accordance with a configuration in the description of FIG. 2A).

A microstructure 258 can be formed in such a way that they have a refractive index that is less than or equal to the layer-thickness-averaged refractive index of the organic functional layer structure.

The birefringent substance of the scattering structure 110 can be introduced into the cavities 260 formed by means of the microstructure 258 in such a way that the cavities are partly filled, completely filled or overfilled with birefringent substance. Overfilled cavities are illustrated in FIG. 2B by means of the region bearing the reference sign 264.

The birefringent substance can be a liquid crystalline substance, for example, wherein the liquid crystalline substance is in a birefringent phase during the operation of the optoelectronic component and the alignment of the orientation of the ordinary and extraordinary refractive indexes can be set electrically. The electrical setting can be formed for example by means of changing the electric field between the third electrode and the fourth electrode. The liquid crystalline substance can be a conventional liquid crystalline polymer, for example, which satisfies the stated requirements. By way of example, the liquid crystalline substance should be in a birefringent phase in a temperature range of approximately −40° C. to approximately +120° C.

Furthermore, particles, for example including the birefringent substance, for example embedded in a matrix, can be introduced into the cavities 260. The particles can be electrically polarizable and have at least one color-changing and/or reflective side. As a result, by means of changing the directional characteristic of the optoelectronic component 100, at the same time it is possible to alter the appearance of the optoelectronic component 100.

Figure 3:
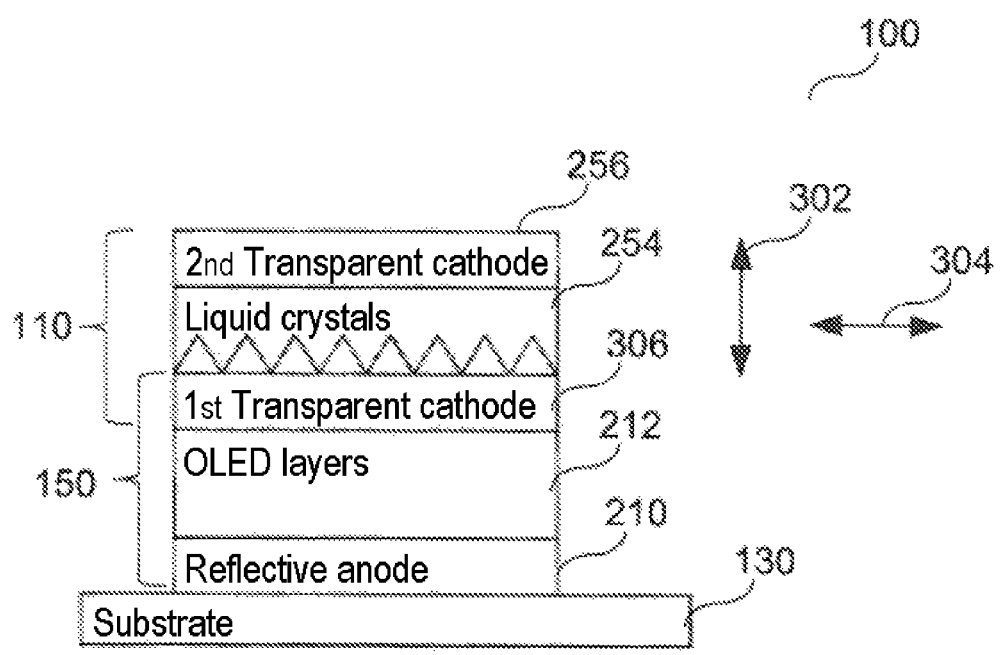
FIG. 3 shows a schematic cross-sectional view of one embodiment of an optoelectronic component.

FIG. 3 shows a schematic cross-sectional view of one embodiment of an optoelectronic component.

The optically active structure 150 and/or a scattering structure 110 (illustrated in FIG. 3) or a plurality of scattering structures (see FIG. 1D) can be formed or applied on and/or above a carrier, for example a hermetically impermeable substrate 130.

The substrate 130 can be formed such that it is transmissive with respect to the electromagnetic radiation. As a result, the carrier can be formed in the beam path of the electromagnetic radiation, for example in the case of an optoelectronic component as bottom emitter.

In the case of an optoelectronic component 100 formed as a top emitter or top absorber (illustrated in FIG. 3), the substrate 130 and/or the first electrode 210 can be formed as opaque and/or reflective. An opaque and/or reflective substrate 130, for example with first electrode 210, can be formed as a metal film or metal-coated film.

The optoelectronic component 100 can be formed in such a way that the scattering structure 110 and the optically active structure 150 include a common electrode 306. By way of example, the electro-optical structure 254 can be formed on the second electrode 214. As a result, the second electrode 214 and the third electrode 252 are formed as a common electrode 306.

In one configuration, the fourth electrode and the first electrode can be formed as a common electrode by virtue of the optically active region (see description of FIG. 2A) being formed on the fourth electrode.

The common electrode 306 can have a ground potential, for example. As a result, the number of electrodes to be contacted can be reduced and a scattering structure 110 monolithically integrated in the optoelectronic component 100 can be formed.

The fourth electrode 256 can have an electrical potential that is less than the electrical potential of the first electrode 210 or of the common electrode 306. Consequently, the common electrode 306 can be a cathode for the optically active structure 150 and an anode for the scattering structure 110. Relative to the optoelectronic component 100 with respect to the first electrode 210, the common electrode can therefore be designated as first cathode 306 and the fourth electrode 256 can be designated as second cathode (illustrated in FIG. 3). Alternatively, the fourth electrode 256 can have an electrical potential that is greater than the electrical potential of the common electrode 306. Consequently, the common electrode 306 can be a cathode for the optically active structure 150 and for the scattering structure 110. Relative to the optoelectronic component 100 with respect to the first electrode 210, the common electrode can therefore be designated as (first) cathode 306 and the fourth electrode 256 can be designated as second anode.

In the case of an optoelectronic component 100 that emits and/or absorbs on one side, the common electrode 306 and the fourth electrode 256 and/or the first electrode 210 should be formed as transmissive, for example transparent or translucent.

Microstructures, for example a microlens array (MLA), can be formed on the common electrode 306. The microstructures can have an arbitrary structure. By way of example, a microstructure can have a pyramidal structure (illustrated in FIG. 3) having straight or curved side faces, for example convex and/or concave. Different directional characteristics of the optoelectronic component can be realized as a result. A microstructure can have a refractive index that is greater than 1.3; for example in a range of approximately 1.5 to approximately 1.8. Such microstructures can also be referred to as coupling-out structure.

A birefringent, electrically polarizable substance is formed on or above the microstructures. Said substance can be formed as liquid crystals, for example. The hollow spaces between the pyramidal microstructures, i.e. the cavities, can be filled with the liquid crystalline substance, such that a plane surface is formed.

The fourth electrode 256 is formed on the liquid crystalline substance in order to be able to influence the orientation of the liquid crystals.

A liquid crystalline substance has a first refractive index along a first crystal axis and a second refractive index along a second crystal axis. By way of example, the liquid crystalline substance E44, at a wavelength of 587.6 nm, has a refractive index along a first crystal axis of approximately 1.527 and along a second crystal axis of approximately 1.786. The refractive index contrast is thus dependent on the crystal orientation of the liquid crystalline substance with respect to the propagation direction of the electromagnetic radiation.

A further suitable liquid crystalline substance is, for example, E7 having a refractive index along a first crystal axis of approximately 1.52237 and along a second crystal axis of approximately 1.73938, in each case at a wavelength of 587.6 nm.

A further suitable liquid crystalline substance is, for example, TL-216 having a refractive index along a first crystal axis of approximately 1.52262 and along a second crystal axis of approximately 1.73132, in each case at a wavelength of 587.6 nm.

The first crystal axis can be the crystal direction with respect to the ordinary ray, and the second crystal direction can be the crystal direction with respect to the extraordinary ray of electromagnetic radiation in a birefringent crystal.

By means of changing an applied voltage via the common electrode 306 and the fourth electrode 256, it is possible to set a refractive index between the first refractive index and the second refractive index. As a result, it is possible to alter the refractive index contrast between microstructure and liquid crystalline substance. The refractive index contrast can also be referred to as refractive index difference. If the absolute value of the refractive index difference is greater than approximately 0.5, electromagnetic radiation can be scattered at an interface with grazing incidence. Depending on the set refractive index, the interface between microstructure and liquid crystalline substance is optically smooth (non-scattering) or optically rough (scattering). The emission characteristic of the OLED can be influenced by means of the orientation of the liquid crystals with respect to the propagation direction of the electromagnetic radiation.

The microstructure can optically delimit the alignment of the liquid crystals. In other words: the scattering structure 110 can scatter the electromagnetic radiation in the case of an orientation of the liquid crystals perpendicular to the propagation direction of the electromagnetic radiation. This will be illustrated in the consideration below:

The scattering structure is formed in such a way that the liquid crystals have in the first crystal direction a refractive index difference with respect to the microstructure that is greater than 0.05 (scattering).

In the second crystal direction, the liquid crystals have a refractive index difference with respect to the microstructure that is less than 0.05 (non-scattering). The first crystal axis can be for example the high index plane of the liquid crystal.

In a first driving of the scattering structure 110, the liquid crystals are oriented in such a way that the first crystal axis is situated in a vertical orientation 302. The OLED is in a non-scattering state. No scattering or additional coupling-out occurs, for example since part of the light is reflected from the interface between the microstructure and the liquid crystals.

In a second driving of the scattering structure 110, the liquid crystals are oriented in such a way that the first crystal axis is situated in a horizontal orientation 304. The OLED is in a coupling-out mode. The light is coupled out symmetrically, that is to say that the microstructures operate as coupling-out structures.

In a third driving of the scattering structure, the liquid crystals are oriented in such a way that the liquid crystals with the first crystal axis are tilted for example by 45° from the vertical orientation 302 toward the left. The second crystal axis is then tilted by 45° toward the right. The light is then coupled out asymmetrically. More light can be coupled out from the optoelectronic component on the side in the direction of the first crystal axis. Less light can be coupled out in the direction of the second crystal axis. The emission characteristic of the OLED can be altered as a result.

In a fourth driving of the scattering structure, the liquid crystals are oriented in such a way that the liquid crystals with the first crystal axis are tilted for example by 45° from the vertical orientation 302 toward the right. The second crystal axis is then tilted by 45° toward the left. The light is coupled out asymmetrically as in the third driving.

In a fifth driving, the control device is driven as in the third driving and fourth driving, but with intermediate stages.

FIG. 4 shows an indication concerning a method for producing an optoelectronic component in accordance with various embodiments.

The method 300 for producing an optoelectronic component includes forming 302 an optically active structure and forming 304 at least one scattering structure in the beam path of the electromagnetic radiation.

The optically active structure is formed for taking up and/or providing an electromagnetic radiation, for example as a light emitting diode, for example a surface light source; as a photodetector, for example a surface detector; or a solar cell.

Forming 302 the optically active structure may include forming a first electrode; forming an organic functional layer structure on or above the first electrode; and forming a second electrode on or above the organic functional layer structure; for example in accordance with one of the configurations from the descriptions of FIG. 1A to FIG. 3. By way of example, the optically active structure can be formed as a bottom emitter and/or a top emitter. Furthermore, the optically active structure can be formed such that it is transmissive with respect to the electromagnetic radiation, for example translucent or transparent. Furthermore, one of the electrodes of the optically active structure can be formed as a mirror structure with respect to the electromagnetic radiation.

The scattering structure is formed in such a way that the directional characteristic of the electromagnetic radiation is electrically variable.

In one configuration, the scattering structure is formed after the optically active structure has been formed. By way of example, the scattering structure can be formed, for example applied, on or above the optically active structure.

In one configuration, the optically active structure is formed after the scattering structure has been formed. By way of example, the optically active structure can be formed, for example applied, on or above the scattering structure.

In one configuration, in the beam path of the electromagnetic radiation, the optically active structure is formed on or above a first scattering structure, and a second scattering structure is formed on or above the optically active structure, for example in the case of an optoelectronic component that emits or absorbs on a plurality of sides.

In one configuration, in the beam path of the electromagnetic radiation, a first scattering structure is formed on or above the optically active structure, and a second scattering structure is formed on or above the first scattering structure. The first scattering structure and the second scattering structure can be formed identically or differently.

By means of the scattering structure, in the case of an electromagnetic radiation emitting optoelectronic component, information can be represented, for example by the scattering structure being laterally structured, for example having different microstructures and/or birefringent substances having different refractive indexes.

Forming the electro-optical structure may include applying a birefringent substance.

Applying the microstructure to the third electrode can be, for example, depositing, printing on and/or spraying on. The microstructure can be structured during or after the process of applying the substance of the microstructure, for example in the course of application by means of a mask or stamp process; or after application by means of selective removal, for example by means of laser ablation.

The microstructure should be formed with respect to the electromagnetic radiation in such a way that an optically non-scattering interface is formed in the case of a first orientation of the birefringent substance and an optically scattering interface is formed in the case of a second orientation of the birefringent substance. By way of example, the microstructure can have pyramidal structures having straight or curved side faces.

Forming a structure with respect to the electromagnetic radiation can take account of the propagation direction, wavelength and polarization of the electromagnetic radiation.

Forming the electro-optical structure may include wet-chemically applying a liquid crystalline substance embedded in a matrix to a microstructure. The electro-optical structure can also be formed as a liquid crystal film that can be applied by adhesive bonding.

In various embodiments, an optoelectronic component and a method for producing an optoelectronic component are provided which make it possible to electrically alter the emission characteristic of organic light emitting diodes.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. An optoelectronic component, comprising an optically active structure designed for taking up and/or providing an electromagnetic radiation and at least one scattering structure formed in the beam path of the electromagnetic radiation on or above the optically active structure, wherein the scattering structure comprises a microstructure and at least one birefringent substance, wherein the microstructure is formed in such a way that cavities are formed and wherein the birefringent substance is formed in the cavities, wherein the microstructure is formed with respect to the electromagnetic radiation in such a way that an optically non-scattering interface is formed in a case of a first orientation of the birefringent substance and an optically scattering interface is formed in a case of a second orientation of the birefringent substance, and wherein the scattering structure is formed in such a way that the directional characteristic of the electromagnetic radiation is electrically variable.

2. The optoelectronic component as claimed in claim 1, wherein the optically active structure comprises a first electrode, a second electrode and an organic functional layer structure, wherein the organic functional layer structure is formed between the first electrode and the second electrode.

3. The optoelectronic component as claimed in claim 1, wherein the optoelectronic component is formed as an organic light emitting diode, an organic solar cell and/or an organic photodetector.

4. The optoelectronic component as claimed in claim 1, wherein the optoelectronic component is formed as a surface component.

5. The optoelectronic component as claimed claim 1, wherein at least one scattering structure is formed on the optically active structure and/or on that side of the carrier which faces away from the optically active structure.

6. The optoelectronic component as claimed in claim 1, wherein the optically active structure is formed between a first scattering structure and a second scattering structure.

7. The optoelectronic component as claimed in claim 1, wherein the birefringent substance comprises at least one liquid crystalline substance.

8. The optoelectronic component as claimed in claim 1, wherein the scattering structure and the optically active structure have a common electrode.

9. A method for producing an optoelectronic component, the method comprising forming an optically active structure for taking up and/or providing an electromagnetic radiation; and forming at least one scattering structure in the beam path of the electromagnetic radiation on or above the optically active structure, wherein the scattering structure is formed with a microstructure and at least a birefringent substance, wherein the microstructure is formed in such a way that cavities are formed and the birefringent substance is formed in the cavities, wherein the microstructure is formed with respect to the electromagnetic radiation in such a way that an optically non-scattering interface is formed in a case of a first orientation of the birefringent substance and an optically scattering interface is formed in a case of a second orientation of the birefringent substance, and wherein the scattering structure is formed in such a way that the directional characteristic of the electromagnetic radiation is electrically variable.

10. The method as claimed in claim 9, wherein the optoelectronic component can be formed in such a way that the scattering structure and the optically active structure include a common electrode.

11. The method as claimed in claim 9, wherein forming the optically active structure comprises forming a first electrode, forming an organic functional layer structure on or above the first electrode, and forming a second electrode on or above the organic functional layer structure.

12. The method as claimed in claim 9, wherein the optoelectronic component is formed as an organic light emitting diode, an organic solar cell and/or an organic photodetector.

13. The method as claimed in claim 9, wherein the optoelectronic component is formed as a surface component.

14. The method as claimed in claim 9, wherein forming at least one scattering structure comprises forming a plurality of scattering structures that are formed in the beam path of the optically active structure, wherein the optically active structure is formed between a first scattering structure and a second scattering structure.

* * * * *

UNITED STATES PATENT AND TRADEMARK OFFICE
CERTIFICATE OF CORRECTION

PATENT NO. : 9,692,016 B2  
APPLICATION NO. : 14/896440  
DATED : June 27, 2017  
INVENTOR(S) : Thomas Wehlus et al.

Page 1 of 1

It is certified that error appears in the above-identified patent and that said Letters Patent is hereby corrected as shown below:

In the Specification

Column 10, Line 56: Please delete "Zn SnO$_4$" after the word "AlZnO" and write "Zn$_2$SnO4" in place thereof.

Column 13, Line 65: Please delete "Cs CO$_3$" between the words "MgAg" and "Cs$_3$PO$_4$" and write "Cs$_2$CO$_3$" in place thereof.

Signed and Sealed this  
Twenty-sixth Day of September, 2017

Joseph Matal  
*Performing the Functions and Duties of the*  
*Under Secretary of Commerce for Intellectual Property and*  
*Director of the United States Patent and Trademark Office*